US008043435B2

(12) United States Patent
Haibara et al.

(10) Patent No.: US 8,043,435 B2
(45) Date of Patent: Oct. 25, 2011

(54) CLEANING LIQUID AND CLEANING METHOD FOR ELECTRONIC MATERIAL

(75) Inventors: Teruo Haibara, Yamaguchi (JP); Yoshihiro Mori, Yamaguchi (JP); Takashi Mouri, Yamaguchi (JP)

(73) Assignee: Siltronic AG, Munich (DE)

( * ) Notice: Subject to any disclaimer, the term of this patent is extended or adjusted under 35 U.S.C. 154(b) by 334 days.

(21) Appl. No.: 11/959,772

(22) Filed: Dec. 19, 2007

(65) Prior Publication Data
US 2008/0156347 A1 Jul. 3, 2008

(30) Foreign Application Priority Data

Dec. 27, 2006 (JP) ................................ 2006-352730
Oct. 25, 2007 (JP) ................................ 2007-277936

(51) Int. Cl.
*B08B 7/04* (2006.01)
*B08B 3/00* (2006.01)
*B08B 5/00* (2006.01)

(52) U.S. Cl. .................... 134/1.3; 134/1; 134/2; 134/37; 134/184; 134/902

(58) Field of Classification Search ............... 134/1, 1.3, 134/2, 37, 184, 902
See application file for complete search history.

(56) References Cited

U.S. PATENT DOCUMENTS

| 4,012,319 | A | * | 3/1977 | Ramirez ........................ 210/707 |
| 4,514,272 | A | * | 4/1985 | Dubreuil et al. ............... 204/514 |
| 4,732,661 | A | * | 3/1988 | Wright ........................ 204/278.5 |
| 5,676,760 | A | * | 10/1997 | Aoki et al. ........................ 134/1.3 |
| 5,709,235 | A | * | 1/1998 | Akanuma et al. .............. 134/111 |
| 6,039,815 | A | * | 3/2000 | Yeol et al. .......................... 134/2 |
| 6,290,777 | B1 | | 9/2001 | Imaoka et al. |
| 6,565,736 | B2 | * | 5/2003 | Park et al. ....................... 205/746 |
| 2002/0027084 | A1 | | 3/2002 | Park et al. |
| 2006/0054191 | A1 | * | 3/2006 | Higuchi et al. .................. 134/34 |
| 2006/0054205 | A1 | * | 3/2006 | Yabe et al. ..................... 134/184 |
| 2006/0260647 | A1 | | 11/2006 | Verhaverbeke et al. |
| 2006/0284325 | A1 | * | 12/2006 | Kohama et al. ............ 261/122.1 |
| 2007/0062555 | A1 | * | 3/2007 | Chang et al. ....................... 134/1 |
| 2007/0286795 | A1 | * | 12/2007 | Chiba et al. ................ 423/580.1 |
| 2009/0233828 | A1 | * | 9/2009 | Suzuki et al. .................. 510/218 |

FOREIGN PATENT DOCUMENTS

| CN | 1163802 A | 11/1997 |
| JP | 2005-169359 A | 6/2005 |
| TW | 1266813 | 11/2006 |

OTHER PUBLICATIONS

Hattori, Takeshi, "New Edition, Clean Technology of Silicon Wafer Surface," Realize Co. Ltd. 2000.
Toda, Masayuki, "Functional Water Learning from the Elements," Japan Industrial Conference on Cleaning, Kogyo Chosakai Publishing Co., Ltd.
Ueyama, Satoshi et al., "The World of Micro-Bubbles," Kogyo Chosakai Publishing Co., Ltd. 2006.
Toda, Masayuki, "Functional Water Learning from the Elements," Japan Industrial Conference on Cleaning, Kogyo Chosakai Publishing Co., Ltd., 2002.
Ferrell, Gary W. et al. "A Novel Cavitation Probe Design and Some Preliminary Measurements of its Application to Megasonic Cleaning", Journal of the Acoustical Society of America, AIP / Acoustical Society of America, Melville, N.Y. U.S. vol. 112, No. 3, Sep. 2002.

* cited by examiner

*Primary Examiner* — Alexander Markoff
(74) *Attorney, Agent, or Firm* — Brooks Kushman P.C.

(57) ABSTRACT

A cleaning liquid for an electronic material, in particular, a silicon wafer, uses ultra-pure water or hydrogen water as raw material water, and performs cleaning in combination with ultrasonic irradiation under the presence of hydrogen microbubbles. The method enables efficient cleaning and removal of particle components and the like on the wafer surface and prevention of re-contamination.

17 Claims, No Drawings

CLEANING LIQUID AND CLEANING METHOD FOR ELECTRONIC MATERIAL

BACKGROUND OF THE INVENTION

1. Field of the Invention

The present invention relates to a cleaning liquid for electronic materials, particularly, silicon wafers, and to a cleaning method using the same.

2. Background Art

Currently, in manufacturing techniques of semiconductor LSIs using silicon wafers, use of large diameter wafers and further fine processing techniques are required. Furthermore, solving problems such as maintenance and improvement of product quality that comes along with complexity of processes and reduction in production cost is also required.

Particularly, in many fields of manufacturing techniques of semiconductor LSIs using silicon wafers, so-called wet treatment steps including treatment by various solutions are essential steps. A particularly important step among the wet treatment steps is a cleaning step. In conventional cleaning steps, improvements have been mainly made at the point of selection of component compositions of cleaning liquids, concentrations thereof, cleaning temperatures, cleaning time and the like (for example, "New Edition, Clean Technology of Silicon Wafer Surface" written and edited by Takeshi Hattori, Realize Co. Ltd. (2000)). However, these conventional techniques were not enough for satisfying demands caused along with recent necessity of further fine processing techniques, complexity of steps, high cleanliness, and reduction in cost. Moreover, recently, dilute chemical solution cleaning, cleaning without chemical solutions and the like are desired by demands for strict environmental protection measures and reduction in cost of waste liquid processing.

As a method for solving these problems, research and development of so-called functional water typified by "ozone water" or "hydrogen water" has been energetically carried out, and practical use thereof has been developed. Practical use of ozone water has been developed in wide fields of semiconductor cleaning in removal of metal impurity contamination and organic substance contamination. Hydrogen water is applied in glass substrate cleaning of liquid crystal displays in order to remove particles (for example, "Functional Water Leaning From the Elements" supervised by Masayuki Toda, edited by Japan Industrial Conference on Cleaning, Kogyo Chosakai Publishing Co., Ltd. (2002)).

Hydrogen water is expected to be used as a substitute for ammonia+hydrogen peroxide (hereinafter, described as "APM") which is widely applied as a cleaning liquid for particle removal in the field of semiconductor cleaning. Hydrogen water is extremely advantageous in terms of chemical solution cost compared with APM; however, it is inferior in particle removal ability. Hydrogen water has been put into practical use since the cleaning level is enough for cleaning of glass substrates for liquid crystal displays; however, it has not been put into practical use in the field of cleaning of semiconductors such as silicon wafers since the cleaning ability is insufficient.

Therefore, the ability of hydrogen water has to be improved so as to develop APM substituting techniques which are low cost in semiconductor cleaning.

SUMMARY OF THE INVENTION

The present invention provides a completely novel method which can be applied generally to cleaning treatment of silicon wafers. The present inventors have carried out diligent research and development with regard to a new cleaning liquid which can satisfy recent strong demands for cleaning treatment of silicon wafers and a cleaning treatment method using the same, and as a result, have surprisingly discovered that the problems can be solved by using ultra-pure water or hydrogen water as a raw material water and using a cleaning liquid in combination with ultrasonic irradiation in the presence of hydrogen micro-bubbles, thereby accomplishing the present invention.

DETAILED DESCRIPTION OF THE PREFERRED EMBODIMENT(S)

Specifically, a cleaning liquid for an electronic material of the present invention is characterized by containing micro-bubbles generated by a hydrogen gas and characterized by being an aqueous liquid to which ultrasonic oscillation is imparted. The cleaning liquid for the electronic material of the present invention is characterized in that the aqueous liquid is ultra-pure water or hydrogen water.

A cleaning method of the present invention is a method characterized by using the cleaning liquid and being carried out in an aqueous liquid in which hydrogen micro-bubbles are present, and under ultrasonic irradiation. In one embodiment, the cleaning method of the present invention is characterized in that the aqueous liquid is ultra-pure water, whereas in a further embodiment, the cleaning method is characterized in that the aqueous liquid is hydrogen water. In further inventive embodiments, additional ingredients may be added, including alkali, alkali and hydrogen peroxide, and/or surfactant(s).

The cleaning method of the present invention is characterized in that the added alkali, when employed contains at least one of sodium hydroxide, potassium hydroxide, ammonia, tetramethylammonium hydroxide (hereinafter, described as "TMAH"), and choline.

Furthermore, the cleaning method of the present invention is characterized in that the electronic material is a silicon wafer. When cleaning treatment is carried out by using the cleaning liquid of the present invention, particle components and the like on the wafer surface can be efficiently cleaned and removed, and re-contamination can be prevented.

A cleaning liquid for electronic materials of the present invention is an aqueous liquid containing micro-bubbles generated by a hydrogen gas and is an aqueous liquid to which ultrasonic oscillation is imparted. The aqueous liquid is characterized by being ultra-pure water or hydrogen water. Furthermore, the cleaning liquid for electronic materials of the present invention includes those to which various additives are added in order to obtain desired properties. The electronic materials herein which can be cleaned by the cleaning liquid of the present invention particularly include silicon wafers.

A cleaning method of the present invention is characterized by using the above described cleaning liquid of the present invention. Specifically, the method is characterized by treating the electronic materials in the aqueous liquid, in which hydrogen micro-bubbles are present, under ultrasonic irradiation.

Electronic Materials

No particular limitation is imposed on the materials, shapes and the like of the electronic materials which can be cleaned by the cleaning method of the present invention. The materials include various materials used in conventional semiconductor manufacturing. Specifically, the materials include Si, Ge, As, or a composite material thereof. In the present invention, the shapes of the electronic materials include various conventionally known shapes and include the shapes formed in various manufacturing steps. In the present invention, particularly materials in the shape of a wafer are preferably used. Most preferably, silicon wafers are used which correspond to stages used in silicon cleaning steps of normal silicon wafer manufacturing steps, and also the steps of semiconductor manufacturing silicon wafers.

Aqueous Liquid

The aqueous liquid of the present invention can contain micro-bubbles generated by the hydrogen gas, is a liquid to which oscillation by ultrasonic waves can be imparted, and means a liquid which at least contains water. Preferably, it does not contain unnecessary impurities in cleaning of the electronic materials, and the liquid of conventionally used cleaning liquid for electronic materials can be used. In the present invention, particularly, use of ultra-pure water is preferred. Furthermore, the ultra-pure water may be subjected to degassing in advance so as to remove dissolved gasses. For example, a pressure-reduced membrane degassing method can be applied as a degassing method for the ultra-pure water.

In the present invention, furthermore, hydrogen water is preferred to be used as the aqueous liquid. No particular limitation is imposed on the preparation method of the hydrogen water which can be used in the present invention, and hydrogen water produced by conventionally known hydrogen water manufacturing apparatus can be used. Herein, the known hydrogen water manufacturing apparatus specifically includes a manufacturing method in which a hydrogen gas is dissolved in ultra-pure water which has undergone pressure-reduced membrane degassing, via a gas permeable membrane (for example, "Functional Water Leaning From the Elements" supervised by Masayuki Toda, edited by Japan Industrial Conference on Cleaning, Kogyo Chosakai Publishing Co., Ltd. (2002)).

Furthermore, also, no particular limitation is imposed on the hydrogen concentration in the cleaning liquid of the present invention, and a concentration in a preferable range can be arbitrarily selected based on the volume, the shape, the number of silicon wafers, installation method, cleaning liquid temperature, cleaning time, other additives of the cleaning liquid, and hydrogen micro-bubbles used at the same time or ultrasonic irradiation conditions, which will be described below, of the cleaning apparatus.

Hydrogen Micro-Bubbles

No particular limitation is imposed on the preparation method of the hydrogen micro-bubbles used in the cleaning method of the present invention, and micro-bubbles can be generated in the cleaning liquid by introducing a hydrogen gas by using a conventional micro-bubble generation method or generation apparatus. As a known micro-bubble generation method, various methods described in documents can be applied (for example, "The World of Micro-Bubbles" written by Satoshi Ueyama and Makoto Miyamoto, Kogyo Chosakai Publishing Co., Ltd. (2006)). The micro-bubble generation apparatus preferably includes high-speed shear flow type micro-bubble generation apparatus.

Also, no particular limitation is imposed on the generation conditions of the hydrogen micro-bubbles used in the cleaning method of the present invention and the amount of generated hydrogen micro-bubbles. The amount of hydrogen micro-bubble generation within a preferable range can be arbitrarily selected based on the volume, the shape, the number of silicon wafers, the installation method, the cleaning liquid temperature, the cleaning time, other additives of the cleaning liquid, and the ultrasonic irradiation conditions, which will be described below and used at the same time, of the cleaning apparatus used.

The hydrogen of the hydrogen micro-bubbles of the present invention includes the case in which the hydrogen includes other components other than hydrogen. Examples of the other components specifically include air, helium, nitrogen, oxygen, and argon.

Also, no particular limitation is imposed on the positions at which the hydrogen micro-bubbles are generated, and the nozzle part of the hydrogen micro-bubbles can be provided at any position of a cleaning container. A preferable position can be arbitrarily selected based on the volume, shape, number of silicon wafers, installation method, cleaning liquid temperature, cleaning time, other additives of the cleaning liquid, and ultrasonic irradiation conditions, which will be described below and used at the same time, of the cleaning apparatus used. Specific examples include a bottom part, a side surface part, an upper part of the cleaning container, and plural parts thereof.

Also, a method in which hydrogen micro-bubbles are generated in a container which is different from the cleaning container and then it is introduced into the cleaning container by using a water conveying pump can be employed. Also, a method in which the cleaning container and a container for hydrogen micro-bubble water manufacturing are connected to each other by circulation piping and the liquid therein is kept being circulated by a water-conveying pump can be employed. Also, a method in which a hydrogen micro-bubble generating apparatus is installed in the middle of water-conveying piping and the hydrogen micro-bubble water is introduced into the cleaning container can be employed.

Ultrasonic Irradiation

No particular limitation is imposed on an ultrasonic irradiation method and apparatus for imparting ultrasonic oscillation of the present invention, and ultrasonic waves can be radiated in the cleaning liquid by using a publicly known ultrasonic irradiation method or ultrasonic irradiation apparatus.

Also, no particular limitation is imposed on the generation conditions of the ultrasonic waves used in the cleaning method of the present invention, for example, the frequency and generated power. Preferable ranges of the conditions can be arbitrarily selected based on the volume, shape, number of silicon wafers, objective cleaning steps, installation method, cleaning liquid temperature, cleaning time, and other additives of the cleaning liquid of the used cleaning apparatus.

A preferable range can be arbitrarily selected for the frequency of ultrasonic waves depending on, for example, the cleaning step used and the particle size of a removal target. Specifically, the ultrasonic frequency is preferably in the range of 20 to 2000 kHz. When the frequency is lower than the range, it is out of the region of so-called ultrasonic waves, and the effects thereof may be deteriorated. When it is higher than the range, sufficient cleaning effects cannot be obtained. Note that, when the ultrasonic frequency is low even within the above described frequency range, damage may be generated on the cleaning target object by the ultrasonic irradiation. In a step in which damage generation due to ultrasonic irradiation is problematic, for example, in a cleaning step of a silicon wafer after polishing treatment, the frequency is preferably 700 kHz or more. The output power is for example 100 to 1000 W; however, no limitation is imposed thereon, and the number of oscillation elements to be installed can be also selected depending on the size or design of the cleaning apparatus or the object of the cleaning treatment.

Also, no limitation is imposed on the position irradiated by the ultrasonic waves, and the generation direction of the ultrasonic waves can be provided at any position of the cleaning container. A preferable position can be arbitrarily selected based on the volume, shape, number of silicon wafers, installation method, cleaning liquid temperature, cleaning time, and other additives of the cleaning liquid of the used cleaning apparatus. Specifically, the method in which irradiation is carried out from a bottom part, side surface part, and upper part of the cleaning container or plural parts thereof can be employed.

Other Additive Components

Other components can be further added to the cleaning liquid used in the cleaning method of the present invention. For example, alkali or a surfactant can be added. Additives particularly suitable as alkali include sodium hydroxide, potassium hydroxide, ammonia, TMAH, and choline. No particular limitation is imposed on the type of the additive agents and the addition amount thereof. They can be arbitrarily selected based on the volume, shape, number of silicon wafers, installation method, cleaning liquid temperature, cleaning time, hydrogen micro-bubbles, ultrasonic irradiation and the like of the used cleaning apparatus.

When a proper amount of hydrogen peroxide is added to alkali, the particle removing ability can be improved, hydrophilicity can be imparted to the wafer surface, and roughness of the surface (haze) can be prevented.

Silicon Wafer During Cleaning

The cleaning method of the present invention is extremely efficient in removing particle contamination on the surfaces of silicon wafers, and, surprisingly, re-contamination by particles and the like can be prevented.

Hereinafter, the cleaning method of the present invention will be described in further detail based on specific examples; however, the present invention is not limited to these examples.

EXAMPLES

Example 1-1

Sample: A P-type mirror silicon wafer surface which had undergone dilute hydrofluoric acid cleaning and then spin drying so as to remove natural oxidation coating and had a hydrophobic surface and a diameter of 200 mm was subjected to spin coating of 10 mL of a solution containing abrasive (liquid obtained by diluting GLANZOX 3900 of Fujimi Chemical Incorporated by 10 million times), thereby contaminating it by the abrasive. As the particle contamination amount herein, 5000 to 10,000 particles having a diameter of 0.13 mm or more adhered to the wafer. In measurement of the number of particles, Surfscan 6220 of KLA-Tencor Corporation was used.

Raw Material Liquid: Ultra-Pure Water

Cleaning Method: The cleaning liquid was continuously introduced into a 40 L-cleaning bath at 6 L/min, thereby causing it to overflow. One nozzle of a micro-bubble generating apparatus (M2-MS/PTFE type manufactured by Nanoplanet Research Institute Corporation.) was provided at a bottom position of the cleaning bath, and micro-bubbles were continuously generated at 1 L/min. Hydrogen gas was used as the gas for bubbles. Micro-bubbles were generated for five minutes before the wafer was introduced into the cleaning bath, and the micro-bubbles were also generated during cleaning. Ultrasonic waves having a frequency of 1 MHZ and output power of 1 kW were irradiated thoroughly during cleaning. The dissolved hydrogen concentration of the cleaning liquid during cleaning was 0.5 ppm.

The sample was immersed therein for five minutes at 20° C. Then, the sample was removed, put into an ultra-pure water bath, and subjected to overflow rinse for five minutes at 20° C. Then, the sample was subjected to spin drying.

In measurement of the number of the particles of the sample wafer after the cleaning, Surfscan 6220 of KLA-Tencor Corporation was used. The removal rate of the particles having a diameter of 0.13 mm or more was obtained from the number of adhering particles before and after the cleaning.

Example 1-2

The procedure of Example 1-1 was followed except that the raw material liquid is 1.4 ppm hydrogen water. The hydrogen water was manufactured by a method in which hydrogen gas was dissolved in ultra-pure water which had undergone pressure-reduced membrane degassing via a gas permeable membrane. The dissolved hydrogen concentration of the cleaning liquid during cleaning was 1.5 ppm Comparative Example 1-1

The procedure of Example 1-2 was followed except that the hydrogen micro-bubbles are not introduced. The dissolved hydrogen concentration in the cleaning liquid during cleaning was 1.4 ppm.

Comparative Example 1-2

The procedure of Example 1-1 was followed except that ultrasonic waves are not irradiated. The dissolved hydrogen concentration in the cleaning liquid during cleaning was 0.5 ppm.

Example 2-1

The procedure of Example 1-1 was followed except that the raw material liquid contains 15 mM of ammonia and 30 mM of hydrogen peroxide.

Example 2-2

The procedure of Example 1-2 was followed except that the raw material liquid contains 15 mM of ammonia and 30 mM of hydrogen peroxide.

Comparative Example 2

The procedure of Comparative Example 1-1 was followed except that the raw material liquid contains 15 mM of ammonia and 30 mM of hydrogen peroxide.

Example 3-1

The procedure of Example 1-1 was followed except that the sample is a silicon wafer immediately after CMP (two millions or more particles having a diameter of 0.13 mm or more are adhering), and the raw material liquid contains 10 mM of TMAH and 30 mM of hydrogen peroxide.

Example 3-2

The procedure of Example 1-2 was followed except that the sample is a silicon wafer immediately after CMP (two millions or more particles having a diameter of 0.13 mm or more are adhering), and the raw material liquid contains 10 mM of TMAH and 30 mM of hydrogen peroxide.

Comparative Example 3

The procedure of Comparative Example 1-1 was followed except that the sample is a silicon wafer immediately after CMP (two millions or more particles having a diameter of 0.13 mm or more are adhering), and the raw material liquid contains 10 mM of TMAH and 30 mM of hydrogen peroxide.

Example 4-1

In order to check the re-adhesion behavior of the removed particles, a silicon wafer having clean surfaces (dried after dilute hydrofluoric acid cleaning so as to remove natural oxidation membranes and obtain hydrophobic surfaces in advance) were put in a same cleaning carrier in the cleaning test of the Example 3-1. The number of adhered particles after cleaning was measured.

Example 4-2

In order to check the re-adhesion behavior of the removed particles, a silicon wafer having clean surfaces (dried after dilute hydrofluoric acid cleaning so as to remove natural oxidation membranes and obtain hydrophobic surfaces in advance) were put in a same cleaning carrier in the cleaning test of the Example 3-2. The number of adhered particles after cleaning was measured.

Comparative Example 4

In order to check the re-adhesion behavior of the removed particles, a silicon wafer having clean surfaces (dried after dilute hydrofluoric acid cleaning so as to remove natural oxidation membranes and obtain hydrophobic surfaces in advance) were put in a same cleaning carrier in the cleaning test of the Comparative Example 3. The number of adhered particles after cleaning was measured.

Examples 5-1 to 5-12

Sample: A P-type mirror silicon wafer which had undergone dilute hydrofluoric acid cleaning and then spin drying so as to remove a natural oxidation membrane and had a hydrophobic surface and a diameter of 200 mm was immersed in 1 N of hydrochloric acid solution in which silicon nitride powder (grain size distribution: 500 nm) was dispersed, thereby causing silicon nitride particles to adhere thereto.

Herein, as the particle contamination amount, 5000 to 10,000 particles having a diameter of 0.1 mm or more adhered. For measuring of the number of particles, LS 6500 produced by Hitachi High-Technologies Corporation was used.

Cleaning Liquid: In each of the examples, a cleaning liquid prepared so as to contain TMAH and hydrogen peroxide having the concentrations shown in a table 3 was used.

Cleaning Method: The 40 L-cleaning bath was filled with the liquid containing TMAH and hydrogen peroxide having the predetermined concentrations shown in the table 3, one nozzle of the micro-bubble generating apparatus (M2-MS/PTFE type produced by Nanoplanet Research Institute Corporation) was provided at a bottom position of the cleaning bath, and micro-bubbles were continuously generated at 1 L/min. Hydrogen gas was used as the gas for bubbles. Micro-bubbles were generated for five minutes before the wafer was introduced into the cleaning bath, and the micro-bubbles were also continuously generated during cleaning. The dissolved hydrogen concentration in the cleaning liquid during cleaning was 0.5 ppm. Ultrasonic waves having a frequency of 1 MHz and output power of 1 kW were irradiated thoroughly during cleaning.

The sample was immersed therein for five minutes at a liquid temperature of 60° C. Then, the sample was removed, put into an ultra-pure water bath, and subjected to overflow rinse for five minutes at 20° C. Then, the sample was subjected to spin drying.

In particle measurement of the sample wafer before and after cleaning, LS 6500 produced by Hitachi High-Technologies Corporation was used. The removal rate of the particles having a diameter of 0.1 mm or more was obtained from the number of adhered particles before and after the cleaning.

Comparative Example 5

The procedures of Examples 5-1 to 5-12 were used except that APM (4700 ppm of ammonia and 31,000 ppm of hydrogen peroxide) was used as the cleaning liquid, and hydrogen micro-bubbles were not used.

TABLE 1

| | Raw Material Liquid | Hydrogen Micro-Bubbles | Ultrasonic irradiation | Dissolved Hydrogen Concentration | Particle Removal Rate (%) 0.13 μm or more |
|---|---|---|---|---|---|
| Example 1-1 | Ultra-pure Water | Yes | Yes | 0.5 ppm | 45% |
| Example 1-2 | Hydrogen Water | Yes | Yes | 1.5 ppm | 47% |
| Comparative Example 1-1 | Hydrogen Water | No | Yes | 1.4 ppm | 40% |
| Comparative Example 1-2 | Ultra-pure Water | Yes | No | 0.5 ppm | 20% |
| Example 2-1 | Ultra-pure Water $NH_3$ $H_2O_2$ | Yes | Yes | 0.5 ppm | 69% |
| Example 2-2 | Hydrogen Water $NH_3$ $H_2O_2$ | Yes | Yes | 1.5 ppm | 72% |
| Comparative Example 2 | Hydrogen Water $NH_3$ $H_2O_2$ | No | Yes | 1.4 ppm | 61% |

TABLE 2

|  | Raw Material Liquid | Hydrogen Micro-Bubbles | Ultra-sonic irradiation | Dissolved Hydrogen Concentration | Surface State of Test Wafer | Particle Number before Cleaning Test 0.13 μm or more | Particle Number after Cleaning Test 0.13 μm or more |
|---|---|---|---|---|---|---|---|
| Ex. 3-1 | Ultra-pure Water TMAH $H_2O_2$ | Yes | Yes | 0.5 ppm | Immediately after CMP | >2 millions | 13,322 |
| Ex. 3-2 | Hydrogen Water TMAH $H_2O_2$ | Yes | Yes | 1.5 ppm | Immediately after CMP | >2 millions | 11,120 |
| Comp. Ex. 3 | Hydrogen Water TMAH $H_2O_2$ | No | Yes | 1.4 ppm | Immediately after CMP | >2 millions | 19,023 |
| Ex. 4-1 | Ultra-pure Water TMAH $H_2O_2$ | Yes | Yes | 0.5 ppm | Hydrophobic | 20-100 | 4820 |
| Ex. 4-2 | Hydrogen Water $NH_3$ $H_2O_2$ | Yes | Yes | 1.5 ppm | Hydrophobic | 20-100 | 3111 |
| Comp. Ex. 4 | Hydrogen Water TMAH $H_2O_2$ | No | Yes | 1.4 ppm | Hydrophobic | 20-100 | 17,985 |

TABLE 3

|  | TMAH Concentration (ppm) | $NH_3$ Concentration (ppm) | $H_2O_2$ Concentration (ppm) | Hydrogen Microbubbles | Surface Roughness (Haze) | Particle Removal Rate (%) 65 nm or more |
|---|---|---|---|---|---|---|
| Ex. 5-1 | 800 | 0 | 500 | Yes | No | 35% |
| Ex. 5-2 | 800 | 0 | 1000 | Yes | No | 30% |
| Ex. 5-3 | 800 | 0 | 3000 | Yes | No | 28% |
| Ex. 5-4 | 800 | 0 | 7000 | Yes | No | 26% |
| Ex. 5-5 | 1600 | 0 | 500 | Yes | Yes | Unmeasurable due to surface roughness |
| Ex. 5-6 | 1600 | 0 | 1000 | Yes | No | 53% |
| Ex. 5-7 | 1600 | 0 | 3000 | Yes | No | 52% |
| Ex. 5-8 | 1600 | 0 | 7000 | Yes | No | 45% |
| Ex. 5-9 | 3000 | 0 | 500 | Yes | Yes | Unmeasurable due to surface roughness |
| Ex. 5-10 | 3000 | 0 | 1000 | Yes | No | 60% |
| Ex. 5-11 | 3000 | 0 | 3000 | Yes | No | 49% |
| Ex. 5-12 | 3000 | 0 | 7000 | Yes | No | 40% |
| Comp. Ex. 5 | 0 | 4700 | 31,000 | No | No | 35% |

Results

Implementation conditions and obtained results are summarized in the table 1 to table 3, from which the following can be understood.

When cleaning is carried out in the presence of hydrogen micro-bubbles and under ultrasonic irradiation, the surface contamination can be significantly removed. It can be understood that, in the Example 1-1, the effects of the micro-bubbles are exerted since the cleaning ability is high although the dissolved hydrogen concentration is lower than the Comparative Example 1-1. The removal ability is further improved when the liquid is maintained to be alkaline. It is also evident that roughness of the surface (haze) can be prevented by adding hydrogen peroxide.

As shown in Table 3, when the hydrogen micro-bubbles are introduced into 800 ppm of TMAH and 500 ppm of hydrogen peroxide, the cleaning ability equivalent to that of general APM (4700 ppm of ammonia and 31,000 ppm of hydrogen peroxide) without hydrogen micro-bubbles is achieved. In other words, it can be understood that the chemical solution concentration can be largely reduced by introducing the hydrogen micro-bubbles. It is also evident that the cleaning ability is improved by increasing the TMAH concentration.

According to the results of the Examples 4-1 and 4-2 and Comparative Example 4, it can be understood that when the hydrogen micro-bubbles are added, re-adhesion of the particles which are removed from the wafer surface and present in the cleaning liquid in the water bath can be significantly suppressed. As a result, improvement in the removal ability of the particles on the wafer surface can be expected.

The cleaning liquid and cleaning methods of silicon wafers according to the present invention can be applied generally to cleaning treatment of silicon wafers which have been conventionally carried out.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for cleaning an electronic material, comprising contacting the electronic material with an aqueous liquid in a cleaning bath wherein hydrogen micro-bubbles are introduced into the cleaning bath and ultrasonic irradiation is imparted to the cleaning bath in the presence of the electronic material.

2. The method of claim 1, wherein the aqueous liquid is ultra-pure water.

3. The method of claim 1, wherein the aqueous liquid is hydrogen water.

4. The method of claim 1, wherein alkali is further added to the aqueous liquid.

5. The method of claim 2, wherein alkali is further added to the aqueous liquid.

6. The method of claim 3, wherein alkali is further added to the aqueous liquid.

7. The method of claim 1, wherein alkali and hydrogen peroxide is added to the aqueous liquid.

8. The method of claim 2, wherein alkali and hydrogen peroxide is added to the aqueous liquid.

9. The method of claim 3, wherein alkali and hydrogen peroxide is added to the aqueous liquid.

10. The method of claim 1, wherein a surfactant is added to the aqueous liquid.

11. The method of claim 2, wherein a surfactant is added to the aqueous liquid.

12. The method of claim 3, wherein a surfactant is added to the aqueous liquid.

13. The method of claim 4, wherein a surfactant is added to the aqueous liquid.

14. The method of claim 7, wherein a surfactant is added to the aqueous liquid.

15. The method of claim 4, wherein the added alkali comprises at least one of sodium hydroxide, potassium hydroxide, ammonia, tetramethylammonium hydroxide (TMAH), or choline.

16. The method of claim 7, wherein the added alkali comprises at least one of sodium hydroxide, potassium hydroxide, ammonia, tetramethylammonium hydroxide (TMAH), or choline.

17. The method of claim 1, wherein the electronic material is a silicon wafer.

* * * * *